United States Patent
Low et al.

(10) Patent No.: US 11,329,206 B2
(45) Date of Patent: May 10, 2022

(54) LEAD FRAME AND HOUSING SUB-ASSEMBLY FOR USE IN A LIGHT EMITTING DIODE PACKAGE AND METHOD FOR MANUFACTURING THE SAME

(71) Applicants: Tek Beng Low, Melaka (MY); Chee Sheng Lim, Melaka (MY)

(72) Inventors: Tek Beng Low, Melaka (MY); Chee Sheng Lim, Melaka (MY)

(73) Assignee: Dominant Opto Technologies SDN BHD

(*) Notice: Subject to any disclaimer, the term of this patent is extended or adjusted under 35 U.S.C. 154(b) by 59 days.

(21) Appl. No.: 17/034,203

(22) Filed: Sep. 28, 2020

(65) Prior Publication Data

US 2022/0102600 A1    Mar. 31, 2022

(51) Int. Cl.
*H01L 33/62* (2010.01)
*H01L 33/00* (2010.01)

(52) U.S. Cl.
CPC .......... *H01L 33/62* (2013.01); *H01L 33/0095* (2013.01); *H01L 2933/0066* (2013.01)

(58) Field of Classification Search
CPC ................. H01L 33/62; H01L 33/0095; H01L 2933/0066
See application file for complete search history.

(56) References Cited

U.S. PATENT DOCUMENTS

| | | | |
|---|---|---|---|
| 5,291,038 A | 3/1994 | Hanamoto et al. | |
| 6,181,003 B1 | 1/2001 | Ohuchi | |
| 6,355,946 B1 | 3/2002 | Ishinaga | |
| 6,407,411 B1 | 6/2002 | Wojnarowski et al. | |
| 6,744,077 B2 | 6/2004 | Trottier et al. | |
| 6,762,551 B2 | 7/2004 | Shiiki et al. | |
| 6,890,085 B2 | 5/2005 | Hacker | |
| 7,038,370 B2 | 5/2006 | Mueller-Mach et al. | |
| 7,083,302 B2 | 8/2006 | Chen et al. | |
| 7,646,029 B2 | 1/2010 | Mueller et al. | |
| 7,655,957 B2 | 2/2010 | Loh et al. | |
| 7,943,941 B2 | 5/2011 | Shimizu et al. | |
| 8,299,701 B2 | 10/2012 | Kolodin et al. | |
| 8,314,479 B2 | 11/2012 | Wai et al. | |
| 8,394,675 B2 | 3/2013 | Wai et al. | |
| 8,564,005 B2 | 10/2013 | Park et al. | |
| 8,674,488 B2 | 3/2014 | Wai et al. | |
| 8,685,762 B2 | 4/2014 | Shimizu et al. | |
| 8,829,780 B2 | 9/2014 | Sakuta et al. | |

(Continued)

FOREIGN PATENT DOCUMENTS

| | | |
|---|---|---|
| WO | WO 2009/072786 | 6/2009 |
| WO | WO 2009/082177 | 7/2009 |
| WO | WO 2015/059258 | 4/2015 |

*Primary Examiner* — Victor A Mandala

(74) *Attorney, Agent, or Firm* — King & Partners, PLC

(57) ABSTRACT

A lead frame and housing sub-assembly for use in a light emitting diode package, including: a lead frame, wherein the lead frame includes a substrate metal alloy having a top surface and a bottom surface, and wherein the top surface and the bottom surface of the substrate have been pre-plated with a layer of nickel; and a housing, wherein the housing includes a top surface and a bottom surface, and wherein at least a portion of the bottom surface of the housing contacts the top surface of the lead frame that has been pre-plated with the layer of nickel.

15 Claims, 8 Drawing Sheets

(56) References Cited

U.S. PATENT DOCUMENTS

| | | |
|---|---|---|
| 8,890,403 B2 | 11/2014 | Sakuta et al. |
| 9,252,347 B2 | 2/2016 | Kong et al. |
| 9,559,275 B2 | 1/2017 | Kong et al. |
| 9,647,181 B2 | 5/2017 | Ishizaki |
| 9,853,194 B2 | 12/2017 | Minato et al. |
| 9,905,736 B2 | 2/2018 | Seki et al. |
| 9,954,145 B2 | 4/2018 | Radkov et al. |
| 9,985,182 B2 | 5/2018 | Watanabe et al. |
| 10,468,564 B1 | 11/2019 | Zhao et al. |
| 2002/0180345 A1 | 12/2002 | Hen |
| 2003/0116769 A1 | 6/2003 | Song et al. |
| 2005/0006794 A1 | 1/2005 | Kashiwagi et al. |
| 2005/0179041 A1 | 8/2005 | Harbers et al. |
| 2006/0012299 A1 | 1/2006 | Suehiro et al. |
| 2006/0108669 A1 | 5/2006 | Matsumoto et al. |
| 2008/0180948 A1 | 7/2008 | Yoon et al. |
| 2011/0186900 A1* | 8/2011 | Watari ................. H01L 24/97 257/E33.059 |
| 2011/0186901 A1* | 8/2011 | Ushiyama ............. H01L 24/85 257/E33.056 |
| 2012/0061703 A1* | 3/2012 | Kobayashi ............ H01L 24/97 257/E33.059 |
| 2012/0273826 A1* | 11/2012 | Yamamoto ............ H01L 24/48 257/E33.059 |
| 2016/0104820 A1 | 4/2016 | Lim |
| 2016/0204321 A1* | 7/2016 | Naka ..................... H01L 33/44 257/98 |
| 2016/0276549 A1 | 9/2016 | Yamashita et al. |
| 2017/0256695 A1* | 9/2017 | Miki ..................... H01L 33/62 |
| 2018/0097162 A1* | 4/2018 | Kato ................... H01L 33/502 |
| 2018/0287019 A1 | 10/2018 | Hashimoto et al. |
| 2019/0086039 A1* | 3/2019 | Lee ......................... F21K 9/90 |
| 2019/0097107 A1* | 3/2019 | Kato ..................... H01L 33/62 |
| 2019/0198559 A1* | 6/2019 | Miki ................... H01L 33/483 |
| 2019/0206772 A1* | 7/2019 | How ................... H01L 21/561 |
| 2021/0043818 A1* | 2/2021 | Miyazaki .............. H01L 33/62 |
| 2021/0083153 A1* | 3/2021 | Kayama ............... H01L 33/62 |

\* cited by examiner

US 11,329,206 B2

LEAD FRAME AND HOUSING SUB-ASSEMBLY FOR USE IN A LIGHT EMITTING DIODE PACKAGE AND METHOD FOR MANUFACTURING THE SAME

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A SEQUENCE LISTING

Not applicable.

BACKGROUND OF THE INVENTION

1. Field of the Invention

The present invention relates in general to light emitting diode (LED) packages, and, more particularly, to lead frame and housing sub-assemblies that enhance product longevity via improved physical and chemical interfacial properties between the lead frame and the housing.

2. Background Art

By way of background, there are two traditional lead frames for use in LED packages, namely: (1) a fully pre-plated lead frame; and (2) a post-plated lead frame. As will be explained in greater detail below, both the fully pre-plated and post-plated lead frames are replete with drawbacks associated with device longevity and physical and chemical integrity of the interface between the lead frame and the housing.

As is shown in prior art FIG. 1, a pre-plated lead frame typically utilizes a copper or iron substrate that is first plated with nickel and subsequently plated with palladium-gold or silver prior to molding the plastic housing and other assembly processes. As is shown in prior art FIG. 2, this results in an interface between the top surface of the substrate (e.g., gold or silver) and the bottom surface of the molded plastic housing that is difficult to hermetically seal. Such sealing difficulties results in poor contact, exposure to moisture, and/or corrosion which can lead to premature device failure.

As is shown in prior art FIG. 3, a post-plated lead frame typically utilizes a copper or iron substrate that is molded with the plastic housing on the bare or un-plated substrate. After the plastic housing is molded onto the substrate, the remaining exposed substrate is post-plated with, for example, nickel-silver, nickel-palladium-gold which then undergoes subsequent assembly processes. As is shown in prior art FIG. 4, this results in an interface between the top surface of the substrate (e.g., copper or iron) and the bottom surface of the molded plastic housing that is susceptible to corrosion and/or migration of copper under dynamic conditions. It is also very difficult and/or costly to prevent oxidation of the copper metal before molding.

The present invention discloses an improved lead frame and housing interface that remedies the above-identified complications associated with the utilization of traditional pre-plated and post-plated substrates.

By way of additional background, LED packages and encapsulants associated with LED packages have been known in the art for years, and are the subject of a plurality of patents and publications, including: U.S. Pat. No. 9,559,275 entitled "Light Emitting Device Package and Light Unit Having the Same," U.S. Pat. No. 8,564,005 entitled "Light-Emitting Device Package," U.S. Pat. No. 8,394,675 entitled "Manufacturing Light Emitting Diode (LED) Packages," U.S. Pat. No. 8,314,479 entitled "Leadframe Package with Recessed Cavity for LED," U.S. Pat. No. 7,646,029 entitled "LED Package Methods and Systems," U.S. Pat. No. 6,407,411 entitled "LED Lead Frame Assembly," United States Patent Application Publication Number 2005/0179041 entitled "Illumination System with LEDs," United States Patent Application Publication Number 2005/0006794 entitled "Silicone Rubber Composition, Light-Emitting Semiconductor Embedding/Protecting Material and Light-Emitting Semiconductor Device," United States Patent Application Publication Number 2003/0116769 entitled "Light Emission Diode Package," United States Patent Application Publication Number 2002/0180345 entitled "Package Structure Containing Two LEDs," International Application Publication Number WO 2015/059258 entitled "LED Encapsulant," International Application Publication Number WO 2009/082177 entitled "Light Emitting Diode Package," and International Application Publication Number WO 2009/072786 entitled "LED Package and Method for Fabricating the Same"—all of which are hereby incorporated herein by reference in their entirety including all references cited therein.

U.S. Pat. No. 9,559,275 appears to disclose a light emitting device package. The light emitting device is a package body that includes a first recess which is provided with a bottom face and a plurality of inner walls surrounding the bottom face, the plurality of inner walls including a first inner wall and a second inner wall, which are opposing walls; a lead frame exposed at the bottom face of the package body, the lead frame including a bottom frame and a reflector exposed along one of the first inner wall and the second inner wall; a light emitting element provided on the lead frame; and a transparent material provided in the package body to cover the light emitting element. A material of the reflector is the same as a material of the bottom frame of the lead frame.

U.S. Pat. No. 8,564,005 appears to disclose a light-emitting device package including: a package main body including a cavity and a lead frame including a mounting portion disposed in the cavity and a plurality of terminal portions; a light-emitting device chip mounted on the mounting portion; a plurality of bonding wires for electrically connecting the plurality of terminal portions and the light-emitting device chip; a light-transmitting encapsulation layer filled in the cavity; and a light-transmitting cap member disposed in the cavity and blocking the encapsulation layer to contact the plurality of bonding wires.

U.S. Pat. No. 8,394,675 appears to disclose a method of manufacturing an LED package that includes mounting a large panel frame/substrate (LPF/S) having a substantially square shape to a ring. The LPF/S includes a plurality of die pads and a corresponding plurality of leads arranged in a matrix pattern. Each of the die pads includes a planar chip attach surface. An LED chip is attached to the planar chip attach surface of each of the die pads. An encapsulant material is applied overlaying the LED chips and at least a part of the LPF/S. Each die pad and corresponding leads are separated from the LPF/S to form individual LED packages.

The steps of attaching the LED chips and applying the encapsulant material are performed while the LPF/S is mounted to the ring.

U.S. Pat. No. 8,314,479 appears to disclose an LED package that includes a die pad having a bottom surface, an upper surface and a centrally located recessed cavity. The recessed cavity has a chip attach surface between the bottom surface and upper surface and sidewalls that extend from the recessed chip attach surface to the upper surface. The package additionally has leads arranged on opposing sides of the die pad. The leads have a bottom surface that is coextensive with the bottom surface of the die pad and an upper surface coextensive with the upper surface of the die pad. An LED chip is attached to the chip attach surface. The package further includes a package body having an encapsulant which fills space between the die pad and leads forming a bottom encapsulant surface that is coextensive with the bottom surfaces of the die pad and leads.

U.S. Pat. No. 7,646,029 appears to disclose methods and systems for LED modules that include an LED die integrated in an LED package with a sub-mount that includes an electronic component for controlling the light emitted by the LED die. The electronic component integrated in the sub-mount may include drive hardware, a network interface, memory, a processor, a switch-mode power supply, a power facility, or another type of electronic component.

U.S. Pat. No. 6,407,411 appears to disclose an improved LED lead frame packaging assembly that includes a thermally conducting, electrically insulating material that enhances the thermal conduction and structural integrity of the assembly, a UV-resistant encapsulant material, and an integral ESD material that reduces electrostatic discharge. The thermally conducting, electrically insulating material creates an electrically insulating, thermally conductive path in the lead frame assembly for dissipation of power and also acts as a mounting structure thus allowing for the use of a soft encapsulant material, preferably a silicone.

United States Patent Application Publication Number 2005/0179041 appears to disclose a system that includes a light emitting diode (LED), such as a projection system, which may be increased by using an LED chip that has a light emitting surface that emits light directly into any medium with a refractive index of less than or equal to approximately 1.25. For example, the LED chip may emit light directly into the ambient environment, such as air or gas, instead of into an encapsulant. The low refractive index decreases the étendue of the LED, which increases luminance. Moreover, without an encapsulant, a collimating optical element, such as a lens, can be positioned close to the light emitting surface of the LED chip, which advantageously permits the capture of light emitted at large angles. A secondary collimating optical element may be used to assist in focusing the light on a target, such as a microdisplay.

United States Patent Application Publication Number 2005/0006794 appears to disclose a silicone rubber composition, comprising: (A) an organopolysiloxane containing at least two aliphatic unsaturated bonds; (B) an organopolysiloxane of resin structure comprising $SiO_2$ units, $R^3{}_nR^4{}_pSiO_{0.5}$ units and $R^3{}_qR^4{}_rSiO_{0.5}$ units wherein $R^3$ is vinyl or allyl, $R^4$ is a monovalent hydrocarbon group free of aliphatic unsaturation, n is 2 or 3, p is 0 or 1, n+p=3, q is 0 or 1, r is 2 or 3, and q+r=3; (C) an organohydrogenpolysiloxane having at least two SiH groups; and (D) a platinum catalyst cures into a silicone rubber having excellent rubbery and strength properties and little surface tack.

United States Patent Application Publication Number 2003/0116769 appears to disclose an LED package, made of ceramic substrates and having a reflective metal plate. This LED package consists of a first ceramic substrate, which has a chip mounting area on its top surface, and is provided with a predetermined conductive pattern formed around the chip mounting area. One or more LED chips are seated on the chip mounting area of the first ceramic substrate, and are connected to the conductive pattern. A second ceramic substrate is mounted on the top surface of the first ceramic substrate and has a cavity at a position corresponding to the chip mounting area. The reflective metal plate is set in the cavity of the second ceramic substrate to surround the LED chips. This LED package effectively controls the luminous intensity of the LED chips and the angular distribution of the luminance. The reflective metal plate also collaterally acts as a heat sink effectively dissipating heat from the LED chips to the surroundings of the LED package.

United States Patent Application Publication Number 2002/0180345 appears to disclose a package structure containing two LEDs (light emitting diodes), which are packaged in cascade and capable of emitting lights with different wavelengths. For example, by packaging a yellow LED die above a blue LED die or packaging a blue LED die above a yellow LED die, a desaturated blue, desaturated yellow or white light can be obtained when a blue light is emitted through a yellow light or a yellow light is emitted through a blue light. The present invention can be a single-anode-single-cathode or a double-anode-single-cathode package structure, wherein the latter structure can continually change the emitted light in a certain range by adjusting input voltages of the anodes.

International Application Publication Number WO 2015/059258 appears to disclose an LED encapsulant comprising a scattering particle mixture, which includes: (i) a linear polymer including a dimethylsiloxane group which has a vinyl end substituent and/or a linear polymer including a methylphenylsiloxane group which has a vinyl end substituent; and (ii) at least one vinyl-based resin selected from the group consisting of a vinyl-based ViMQ resin.

International Application Publication Number WO 2009/082177 appears to disclose a light emitting diode (LED) package that includes a light emitting diode (LED) package that includes a pair of lead frames connected with at least one LED chip through a metal wire, a package body integrally fixed with the lead frames and having a cavity having an open top, a lead frame bent downwardly to a lower part of an external mounting surface of the package body, a light-transmissive, transparent resin covering the LED chip and filling the cavity, a recess formed in a bottom surface of the cavity, in which the LED chip is mounted, and a transparent resin including a fluorescent material formed in the recess and the cavity. Accordingly, the amount of light-transmissive, transparent resin filling the cavity is reduced to save on manufacturing costs, and the height of the resin is lowered to improve the luminance of light. Also, the height of the package body is lowered, contributing to manufacturing a small product.

International Application Publication Number WO 2009/072786 appears to disclose an LED package that comprises a base having an LED chip mounted thereon, an encapsulation member formed by a light-transmittable resin to encapsulate the LED chip, and a housing formed to expose a top portion of the encapsulation member and to encompass a side surface of the encapsulation member, wherein the encapsulation member is formed by a transfer molding process using a mold to have a predetermined shape. Further, the housing may be light-transmittable.

While the above-identified patents and publications do appear to disclose a plurality of LED substrate and housing configurations, none of the above-identified patents and publications appear to disclose an improved light emitting diode package that includes a lead frame and housing interface as is disclosed herein.

These and other objects of the present invention will become apparent in light of the present specification, claims, and drawings.

SUMMARY OF THE INVENTION

The present invention is directed to a lead frame and housing sub-assembly for use in a light emitting diode package comprising, consisting essentially of, and/or consisting of: (a) a lead frame, wherein the lead frame comprises a substrate metal alloy having a top surface and a bottom surface, and wherein the top surface and the bottom surface of the substrate have been pre-plated with a layer of nickel; and (b) a housing, wherein the housing includes a top surface and a bottom surface, and wherein at least a portion of the bottom surface of the housing contacts the top surface of the lead frame that has been pre-plated with the layer of nickel.

In a preferred embodiment of the present invention, the layer of nickel comprises a single layer of nickel.

In another preferred embodiment of the present invention, the pre-plated layer of nickel ranges in thickness from approximately 0.5 microns to approximately 5.0 microns, and more preferably from approximately 0.5 microns to approximately 3.0 microns.

In yet another preferred embodiment of the present invention, the substrate metal alloy comprises one or more transition metals, such as, but not limited to, copper, alloys of copper, iron, and alloys of iron—just to name a few.

In one embodiment of the present invention, the housing comprises a thermoplastic.

In a preferred embodiment of the present invention, the lead frame is post-plated with one or more transition metals, such as, but not limited to, silver, gold, and palladium-gold—just to name a few.

The present invention is also directed to a lead frame and housing sub-assembly for use in a light emitting diode package comprising, consisting essentially of, and/or consisting of: (a) a lead frame, wherein the lead frame comprises a substrate metal alloy having a top surface and a bottom surface, and wherein the top surface and the bottom surface of the substrate have been pre-plated with a single layer of nickel having a thickness ranging from 0.5 microns to 3 microns; and (b) a thermoplastic housing, wherein the thermoplastic housing includes a top surface and a bottom surface, and wherein at least a portion of the bottom surface of the thermoplastic housing contacts the top surface of the lead frame that has been pre-plated with the single layer of nickel.

The present invention is yet further directed to a method for manufacturing a lead frame and housing sub-assembly for use in a light emitting diode package, comprising, consisting essentially of, and/or consisting of the steps of: (a) providing a lead frame substrate having a top surface and a bottom surface; (b) plating the top surface and bottom surface of the lead frame substrate with a layer of nickel having a thickness ranging from 0.5 microns to 3.0 microns; (c) molding a plastic housing onto at least a portion of the lead frame substrate; and (d) plating any exposed portion of the lead frame substrate with a transition metal and/or transition metal alloy.

In a preferred embodiment of the present invention, the method further comprises the subsequent step of processing of at least one of chip setting, wire bonding, and encapsulating.

BRIEF DESCRIPTION OF THE DRAWINGS

Certain embodiments of the present invention are illustrated by the accompanying figures. It will be understood that the figures are not necessarily to scale and that details not necessary for an understanding of the invention or that render other details difficult to perceive may be omitted.

It will be further understood that the invention is not necessarily limited to the particular embodiments illustrated herein.

Figure 1:
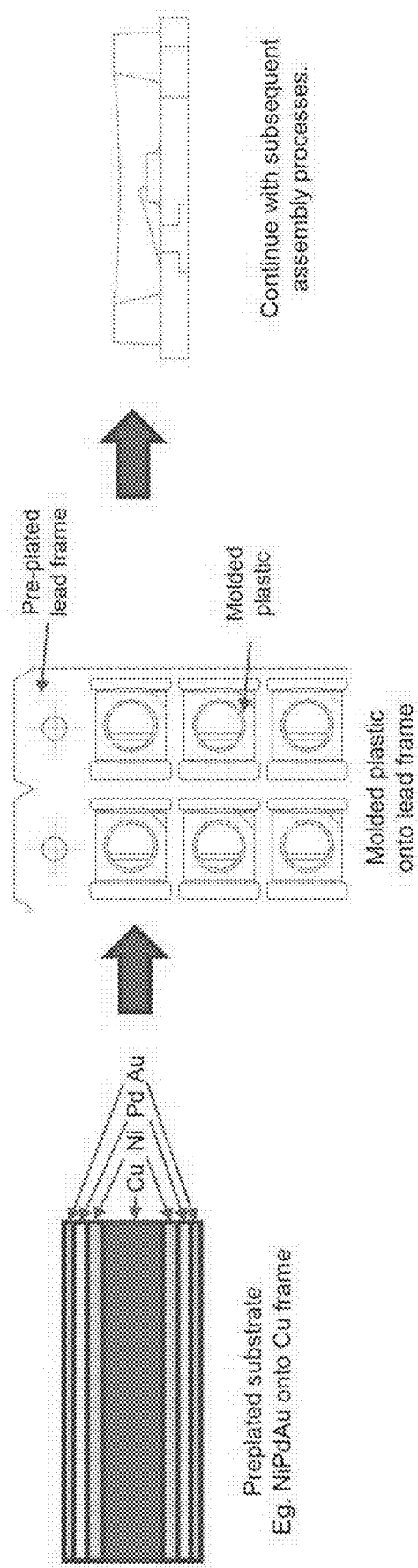
Figure 2:
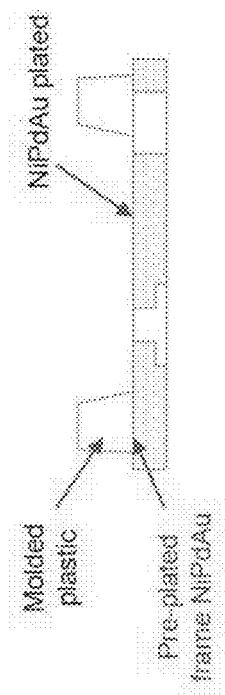
Figure 3:
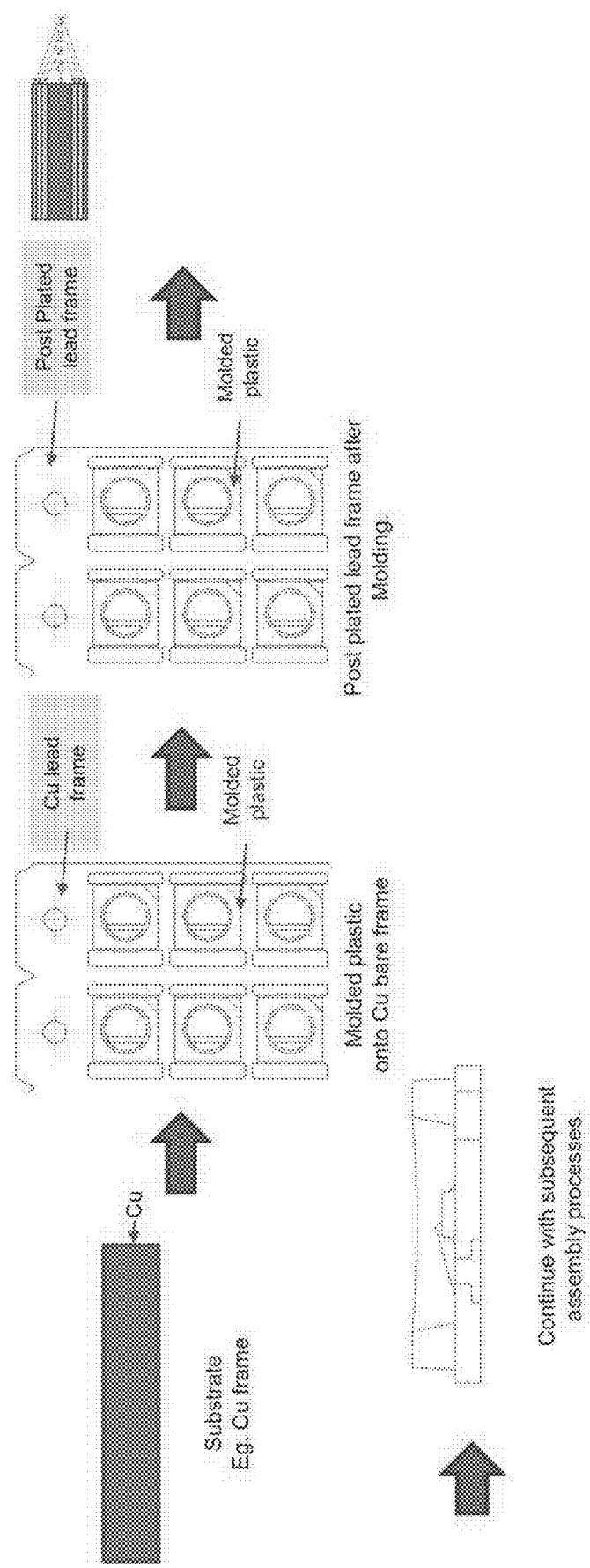
Figure 4:
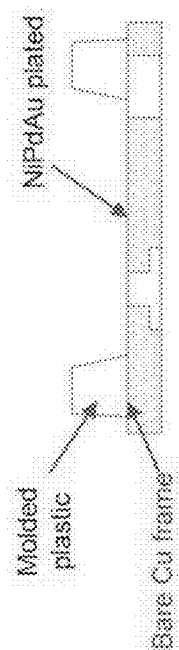
Figure 5:
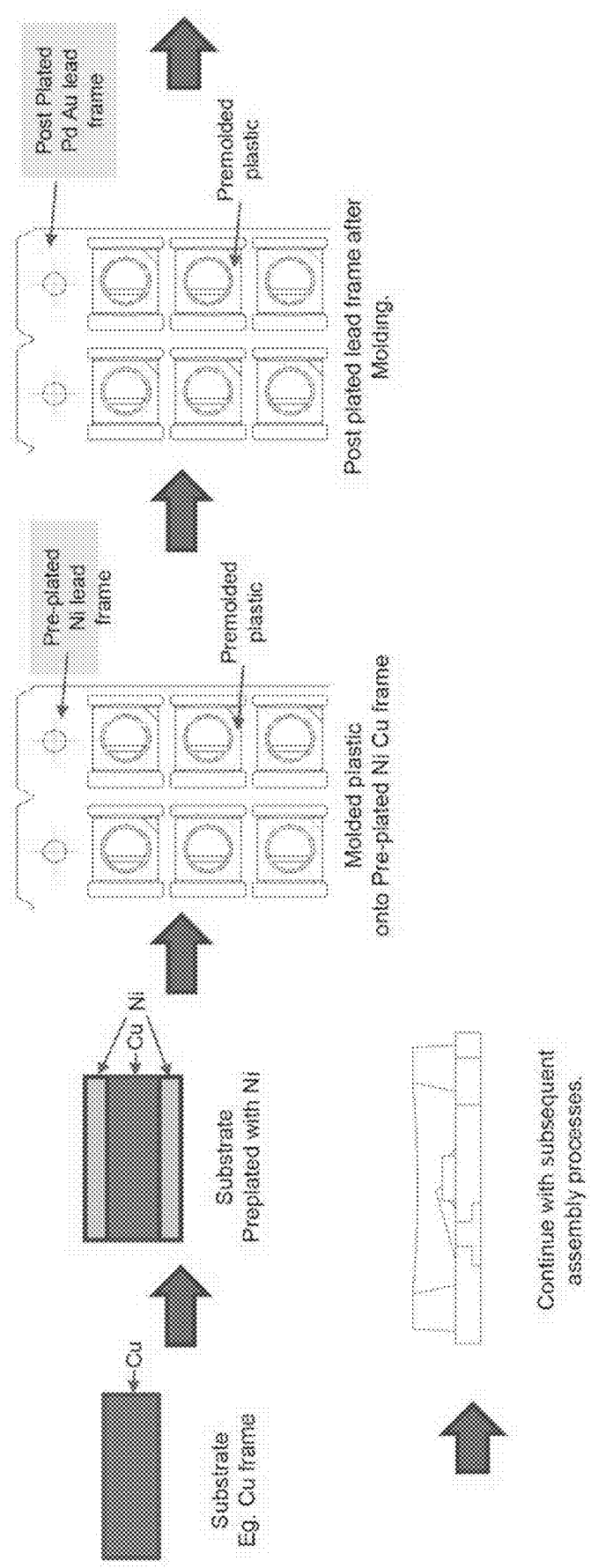
Figure 6:
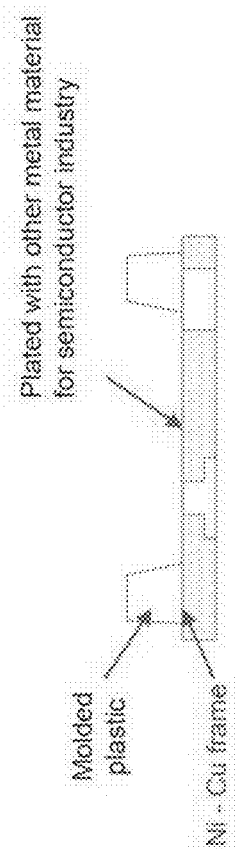
Figure 7:
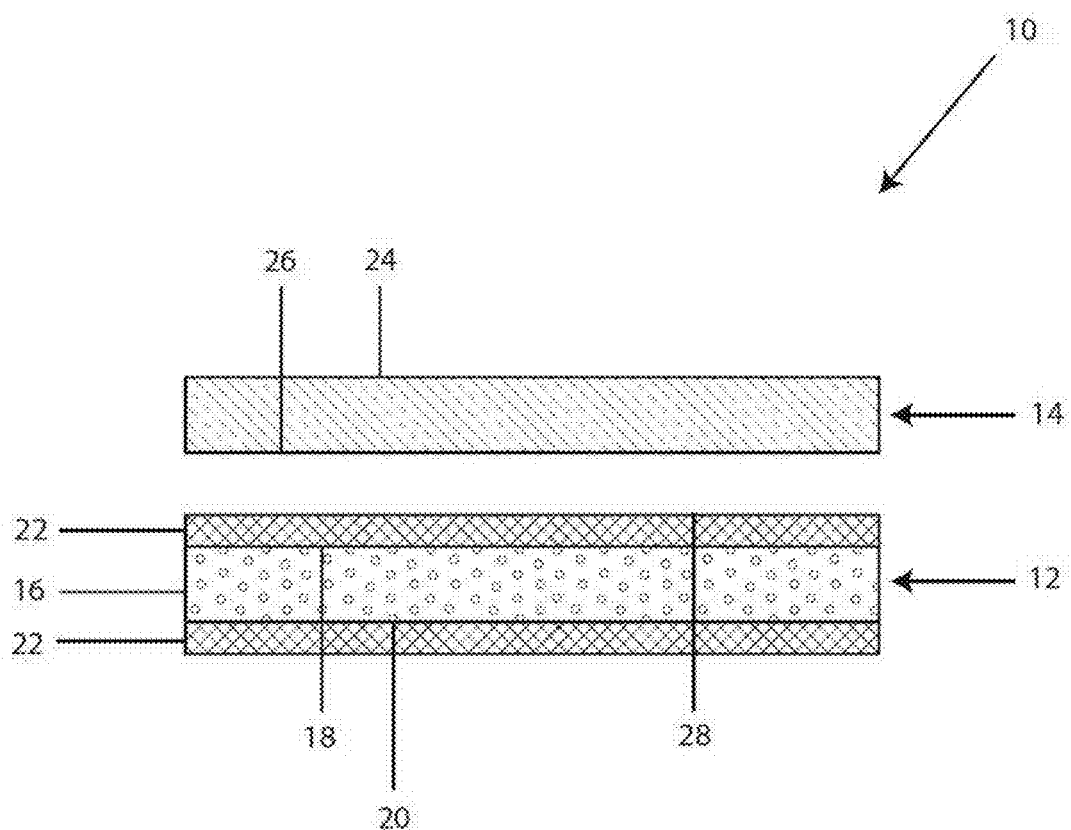
Figure 8:
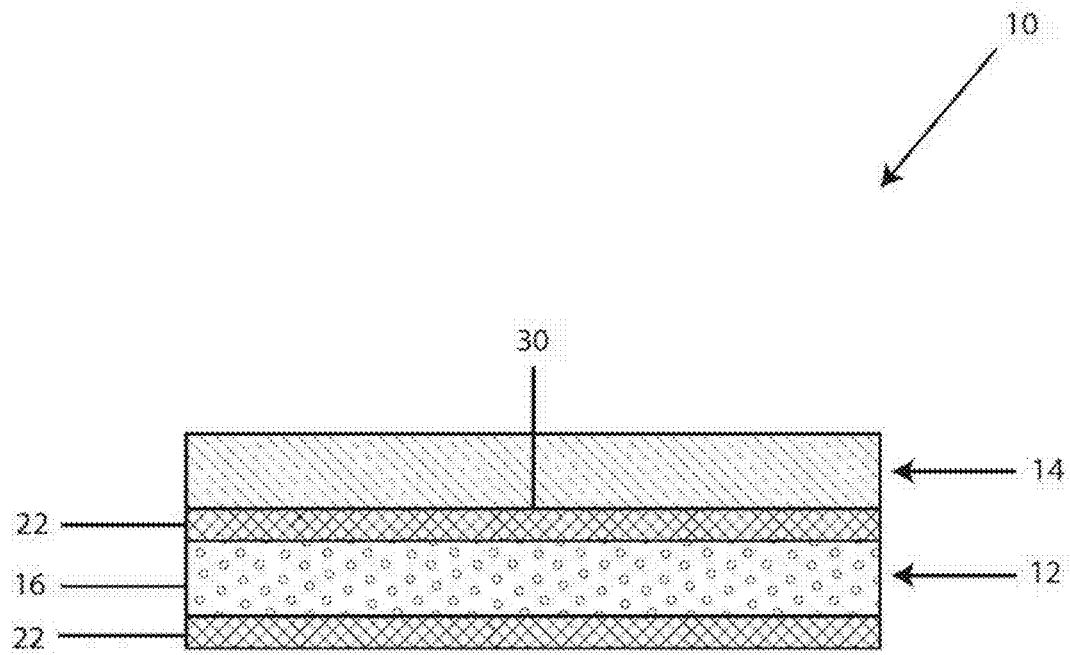

The invention will now be described with reference to the drawings wherein:

FIG. 1 is a prior art process flow diagram showing a fully pre-plated frame;

FIG. 2 is a cross-sectional view of a prior art light emitting diode package showing the plating location and frame/housing interface;

FIG. 3 is a prior art process flow diagram showing a fully post-plated frame;

FIG. 4 is a cross-sectional view of a prior art light emitting diode package showing the plating location and frame/housing interface;

FIG. 5 is a process flow diagram of the present invention;

FIG. 6 is a cross-sectional view of a light emitting diode package showing the plating location and frame/housing interface in accordance with the present invention;

FIG. 7 is an exploded cross-sectional view of a lead frame and housing sub-assembly for use in a light emitting diode package; and FIG. 8 is a cross-sectional view of a lead frame and housing sub-assembly for use in a light emitting diode package showing the interface therebetween.

DETAILED DESCRIPTION OF THE INVENTION

While this invention is susceptible of embodiment in many different forms, there is shown in the drawings and described herein in detail several specific embodiments with the understanding that the present disclosure is to be considered as an exemplification of the principles of the invention and is not intended to limit the invention to the embodiments illustrated.

It will be understood that like or analogous elements and/or components, referred to herein, may be identified throughout the drawings by like reference characters. In addition, it will be understood that the drawings are merely schematic representations of one or more embodiments of the invention, and some of the components may have been distorted from their actual scale for purposes of pictorial clarity.

As will be explained in greater detail hereinbelow, the present invention is directed to an improved light emitting diode package that includes a lead frame and housing sub-assembly having a substrate that has been pre-plated with a layer of nickel which results in the bottom surface of the housing contacting the top surface of the lead frame that has been pre-plated with the layer of nickel.

Referring now to FIG. 5 in a first embodiment of the present invention, a lead frame utilizing, for example, a copper or iron substrate is plated with one or more thin layers (e.g., 0.5 microns-5 microns) of nickel. Next, the plastic housing is molded onto the metal alloy substrate. The remaining exposed substrate is then plated with, for example, nickel-silver, nickel-palladium-gold which then undergoes subsequent assembly processes. As is shown in FIG. 6, this results in an interface between the top surface of the substrate (e.g., nickel) and the bottom surface of the molded plastic housing that is superior to traditional interfaces. In particular, the nickel protects the copper from corrosion, and there is improved adhesion between the molded plastic and the nickel plated substrate because nickel has an inherently rougher surface texture than copper and iron.

Referring now to FIGS. 7-8, the present invention is also directed to lead frame and housing sub-assembly 10 for use in a light emitting diode package. Sub-assembly 10 includes lead frame 12 and housing 14.

Lead frame 12 includes base substrate 16 having top surface 18 and bottom surface 20. Top and bottom surfaces 18 and 20, respectively, are plated with one or more thin layers (e.g., preferably 0.5 microns to 5.0 microns, more preferably 0.5 microns to 3.0 microns) of nickel 22.

Housing 14 includes top surface 24 and bottom surface 26. At least a portion of bottom surface 26 of housing 14 contacts outermost surface 28 of lead frame 12 that has been plated with layer of nickel 22 to form interface 30 (See FIG. 8).

In a preferred embodiment of the present invention, substrate 16 comprises one or more transition metals, including, but not limited to, copper, an alloy of copper, iron, an alloy of iron, etcetera.

The present invention is also directed to a method for manufacturing a lead frame and housing sub-assembly for use in a light emitting diode package, comprising the steps of: (a) providing a lead frame substrate having a top surface and a bottom surface; (b) plating the top surface and bottom surface of the lead frame substrate with a layer of metal (e.g., nickel) having a thickness ranging from 0.5 microns to 5.0 microns; (c) molding a plastic housing onto at least a portion of the lead frame substrate; and (d) plating any exposed portion of the lead frame substrate with a transition metal and/or transition metal alloy. In a preferred embodiment of the present invention, the method further comprising the subsequent steps of processing of at least one of chip setting, wire bonding, and encapsulating.

It will be understood that for the areas exposed after molding (e.g., the inner cup region), these areas can be plated with other metal material which is commonly used in semiconductor industry for the subsequent assembly processes.

The foregoing description merely explains and illustrates the invention and the invention is not limited thereto except insofar as the appended claims are so limited, as those skilled in the art who have the disclosure before them will be able to make modifications without departing from the scope of the invention.

While certain embodiments have been illustrated and described, it should be understood that changes and modifications can be made therein in accordance with ordinary skill in the art without departing from the technology in its broader aspects as defined in the following claims.

The embodiments, illustratively described herein may suitably be practiced in the absence of any element or elements, limitation or limitations, not specifically disclosed herein. Thus, for example, the terms "comprising," "including," "containing," etcetera shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the claimed technology. Additionally, the phrase "consisting essentially of" will be understood to include those elements specifically recited and those additional elements that do not materially affect the basic and novel characteristics of the claimed technology. The phrase "consisting of" excludes any element not specified.

The present disclosure is not to be limited in terms of the particular embodiments described in this application. Many modifications and variations can be made without departing from its spirit and scope, as will be apparent to those skilled in the art. Functionally equivalent methods and compositions within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can of course vary. It is also to be understood that the terminology used herein is for the purpose of describing particular embodiments only, and is not intended to be limiting.

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etcetera. As a non-limiting example, each range discussed herein can be readily broken down into a lower third, middle third and upper third, etcetera. As will also be understood by one skilled in the art all language such as "up to," "at least," "greater than," "less than," and the like, include the number recited and refer to ranges which can be subsequently broken down into subranges as discussed above. Finally, as will be understood by one skilled in the art, a range includes each individual member.

All publications, patent applications, issued patents, and other documents referred to in this specification are herein incorporated by reference as if each individual publication, patent application, issued patent, or other document was specifically and individually indicated to be incorporated by reference in its entirety. Definitions that are contained in text incorporated by reference are excluded to the extent that they contradict definitions in this disclosure.

Other embodiments are set forth in the following claims.

What is claimed and desired to be secured by letters patent of the United States is:

1. A lead frame and housing sub-assembly for use in a light emitting diode package, comprising:

a lead frame, wherein the lead frame comprises a substrate metal alloy having a top surface and a bottom surface, and wherein the top surface and the bottom surface of the substrate have been pre-plated with a layer of nickel, and wherein the lead frame is post-plated with a transition metal; and a housing, wherein the housing includes a top surface and a bottom surface, and wherein at least a portion of the bottom surface of the housing contacts the top surface of the lead frame that has been pre-plated with the layer of nickel.

2. The sub-assembly according to claim 1, wherein the layer of nickel comprises a single layer of nickel.

3. The sub-assembly according to claim 1, wherein the substrate comprises copper.

4. The sub-assembly according to claim 1, wherein the substrate comprises an alloy of copper.

5. The sub-assembly according to claim 1, wherein the substrate comprises iron.

6. The sub-assembly according to claim 1, wherein the substrate comprises an alloy of iron.

7. The sub-assembly according to claim 1, wherein the pre-plated layer of nickel ranges in thickness from approximately 0.5 microns to approximately 5.0 microns.

8. The sub-assembly according to claim 1, wherein the pre-plated layer of nickel ranges in thickness from approximately 0.5 microns to approximately 3.0 microns.

9. The sub-assembly according to claim 1, wherein the housing comprises a thermoplastic or thermoset.

10. The sub-assembly according to claim 1, wherein the transition metal comprises silver.

11. The sub-assembly according to claim 1, wherein the transition metal comprises gold.

12. The sub-assembly according to claim 1, wherein the transition metal comprises palladium-gold.

13. A lead frame and housing sub-assembly for use in a light emitting diode package, comprising:

a lead frame, wherein the lead frame comprises a substrate metal alloy having a top surface and a bottom surface, and wherein the top surface and the bottom surface of the substrate have been pre-plated with a single layer of nickel having a thickness ranging from 0.5 microns to 3 microns, and wherein the lead frame is post-plated with at least one of silver, gold, palladium, and palladium-gold; and a thermoplastic housing, wherein the thermoplastic housing includes a top surface and a bottom surface, and wherein at least a portion of the bottom surface of the thermoplastic housing contacts the top surface of the lead frame that has been pre-plated with the single layer of nickel.

14. A method for manufacturing a lead frame and housing sub-assembly for use in a light emitting diode package, comprising the steps of:

providing a lead frame substrate having a top surface and a bottom surface;

plating the top surface and bottom surface of the lead frame substrate with a layer of nickel having a thickness ranging from 0.5 microns to 3.0 microns;

molding a plastic housing onto at least a portion of the lead frame substrate; and plating any exposed portion of the lead frame substrate with a transition metal and/or transition metal alloy.

15. The method according to claim 14, further comprising the subsequent step of processing of at least one of chip setting, wire bonding, and encapsulating.

* * * * *